United States Patent
Yu et al.

(10) Patent No.: US 10,268,868 B2
(45) Date of Patent: *Apr. 23, 2019

(54) FINGERPRINT SENSOR DEVICE AND METHOD

(71) Applicant: Taiwan Semiconductor Manufacturing Company, Ltd., Hsinchu (TW)

(72) Inventors: Chen-Hua Yu, Hsinchu (TW); Yu-Feng Chen, Hsinchu (TW); Chih-Hua Chen, Zhubei (TW); Hao-Yi Tsai, Hsinchu (TW); Chung-Shi Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/877,978

(22) Filed: Jan. 23, 2018

(65) Prior Publication Data

US 2018/0150667 A1    May 31, 2018

Related U.S. Application Data

(62) Division of application No. 15/149,903, filed on May 9, 2016, now Pat. No. 9,875,388.
(Continued)

(51) Int. Cl.
*G06K 9/00* (2006.01)
*H01L 21/56* (2006.01)
(Continued)

(52) U.S. Cl.
CPC ......... *G06K 9/0002* (2013.01); *G06K 9/0004* (2013.01); *H01L 21/56* (2013.01);
(Continued)

(58) Field of Classification Search
CPC ..... G06K 9/0002; H01L 23/481; H01L 25/16; H01L 21/56; H01L 21/76885;
(Continued)

(56) References Cited

U.S. PATENT DOCUMENTS

| 9,589,941 B1 | 3/2017 | Chen et al. |
| 2013/0069188 A1 | 3/2013 | Chen et al. |

(Continued)

FOREIGN PATENT DOCUMENTS

| KR | 102014142573 A | 12/2014 |
| KR | 20150018358 A | 2/2015 |

(Continued)

*Primary Examiner* — Caleen O Sullivan
(74) *Attorney, Agent, or Firm* — Slater Matsil, LLP

(57) ABSTRACT

A fingerprint sensor package and method are provided. The fingerprint sensor package comprises a fingerprint sensor along with a fingerprint sensor surface material and electrical connections from a first side of the fingerprint sensor to a second side of the fingerprint sensor. A high voltage chip is connected to the fingerprint sensor and then the fingerprint sensor package with the high voltage chip are connected to a substrate, wherein the substrate has an opening to accommodate the presence of the high voltage chip.

20 Claims, 10 Drawing Sheets

Related U.S. Application Data

(60) Provisional application No. 62/300,164, filed on Feb. 26, 2016.

(51) Int. Cl.

| | | |
|---|---|---|
| *H01L 25/16* | (2006.01) | |
| *H01L 23/00* | (2006.01) | |
| *H01L 23/498* | (2006.01) | |
| *H01L 23/48* | (2006.01) | |
| *H01L 23/31* | (2006.01) | |
| *H01L 21/768* | (2006.01) | |

(52) U.S. Cl.
CPC .. *H01L 21/76885* (2013.01); *H01L 21/76898* (2013.01); *H01L 23/3128* (2013.01); *H01L 23/481* (2013.01); *H01L 23/49838* (2013.01); *H01L 24/03* (2013.01); *H01L 24/05* (2013.01); *H01L 24/11* (2013.01); *H01L 24/17* (2013.01); *H01L 24/81* (2013.01); *H01L 25/16* (2013.01); *H01L 2224/024* (2013.01); *H01L 2224/0231* (2013.01); *H01L 2224/02372* (2013.01); *H01L 2224/0345* (2013.01); *H01L 2224/03452* (2013.01); *H01L 2224/03462* (2013.01); *H01L 2224/0401* (2013.01); *H01L 2224/05024* (2013.01); *H01L 2224/05082* (2013.01); *H01L 2224/05083* (2013.01); *H01L 2224/05144* (2013.01); *H01L 2224/05147* (2013.01); *H01L 2224/05155* (2013.01); *H01L 2224/05166* (2013.01); *H01L 2224/05171* (2013.01); *H01L 2224/05184* (2013.01); *H01L 2224/11849* (2013.01); *H01L 2224/13111* (2013.01); *H01L 2224/13139* (2013.01); *H01L 2224/13147* (2013.01); *H01L 2224/16227* (2013.01); *H01L 2224/8101* (2013.01); *H01L 2224/81024* (2013.01); *H01L 2224/81191* (2013.01); *H01L 2224/81815* (2013.01); *H01L 2924/01013* (2013.01); *H01L 2924/01022* (2013.01); *H01L 2924/01029* (2013.01); *H01L 2924/0132* (2013.01); *H01L 2924/01074* (2013.01); *H01L 2924/04941* (2013.01); *H01L 2924/04953* (2013.01); *H01L 2924/06* (2013.01); *H01L 2924/07025* (2013.01); *H01L 2924/15311* (2013.01); *H01L 2924/2064* (2013.01)

(58) Field of Classification Search
CPC ... H01L 21/76898; H01L 24/03; H01L 24/05; H01L 23/49838; H01L 23/3128; H01L 24/11; H01L 24/81; H01L 24/17; H01L 2924/2064; H01L 2224/0231; H01L 2924/15311; H01L 2224/0401; H01L 2224/05024; H01L 2224/16227; H01L 2224/05171; H01L 2224/05147; H01L 2224/05144; H01L 2224/05166; H01L 2224/05184; H01L 2224/05082; H01L 2224/05083; H01L 2924/0132; H01L 2224/03462; H01L 2224/0345; H01L 2224/03452; H01L 2224/02372; H01L 2224/024; H01L 2924/07025; H01L 2924/06; H01L 2924/01029; H01L 2924/01022; H01L 2924/01074; H01L 2224/13111; H01L 2224/13139; H01L 2224/13147; H01L 2224/11849; H01L 2224/81191; H01L 2224/81024; H01L 2224/81815; H01L 2224/8101; H01L 2924/04953

USPC .......................................................... 257/414
See application file for complete search history.

(56) References Cited

U.S. PATENT DOCUMENTS

| | | |
|---|---|---|
| 2016/0350572 A1 | 12/2016 | Kim et al. |
| 2017/0140202 A1* | 5/2017 | Huang ............... G06K 9/00053 |

FOREIGN PATENT DOCUMENTS

| | | |
|---|---|---|
| TW | 201126681 A | 8/2011 |
| TW | 201421754 A | 6/2014 |

* cited by examiner

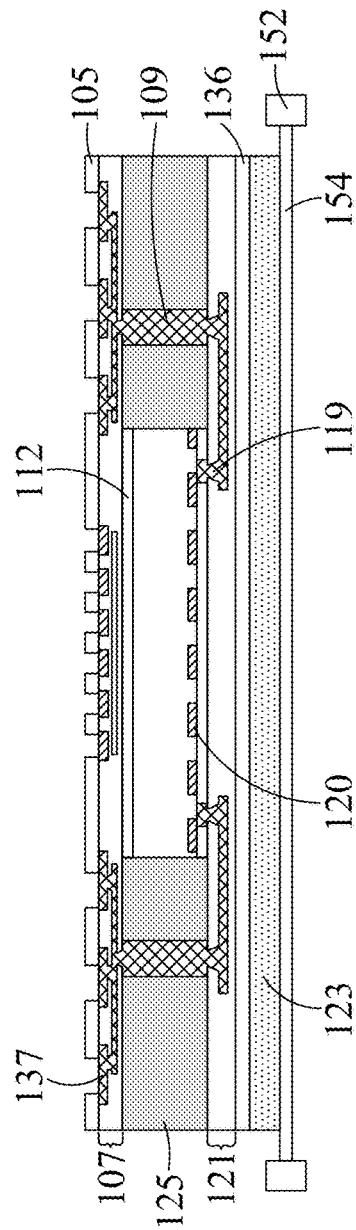
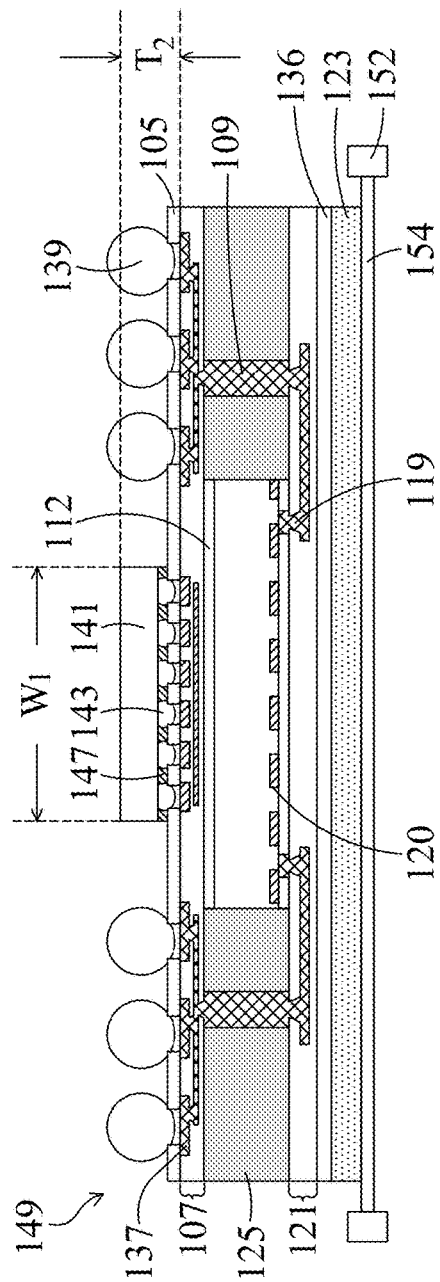
Figure 1C
Figure 1D

FINGERPRINT SENSOR DEVICE AND METHOD

PRIORITY CLAIM AND CROSS-REFERENCE

This application is a divisional of and claims priority to U.S. patent application Ser. No. 15/149,903, filed on May 9, 2016, entitled "Fingerprint Sensor Device and Method," which application claims priority to and the benefit of U.S. Provisional Application No. 62/300,164, filed on Feb. 26, 2016, entitled "Fingerprint Sensor Module," which applications are hereby incorporated herein by reference in their entirety.

BACKGROUND

As user devices become smaller and more portable, it has become easier for people with ill intentions to steal user devices. When such devices bear sensitive information of the user, thieves may be able to access such information unless barriers have been placed into the user device. Once such barrier is a fingerprint sensor which can be used to read the fingerprint of the person attempting to access the device and, if the fingerprint is not the same fingerprint of the user, access may be denied.

However, as user devices such as cell phones become smaller, there is a pressure on each of the individual components within the user device to also see a concurrent reduction in size. As such, there is a pressure to reduce the size of the fingerprint package that contains the fingerprint sensor without seeing a reduction in performance. As such, improvements are needed to see the desired reduction in size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1F illustrate a fingerprint sensor package which uses through vias laterally removed from a sensor in accordance with some embodiments.

DETAILED DESCRIPTION

Figure 1A:
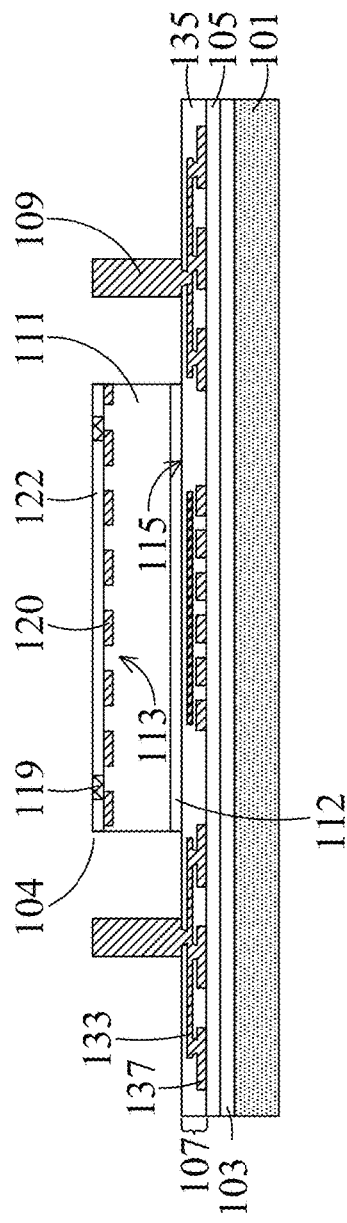

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a fingerprint sensor in a system in package (SiP) solution or else an integrated fan out (InFO) structure. However, embodiments may be used in any suitable package.

With reference now to FIG. 1A, there is illustrated an embodiment which utilizes a carrier substrate 101, an adhesion layer 103, a polymer layer 105, a first redistribution layer 107, first through substrate vias (TSVs) 109, and a fingerprint sensor 104. In an embodiment the carrier substrate 101 comprises, for example, silicon based materials, such as glass or silicon oxide, or other materials, such as aluminum oxide, combinations of any of these materials, or the like. The carrier substrate 101 is planar in order to accommodate an attachment of devices such as the fingerprint sensor 104.

The adhesive layer 103 may be placed over the carrier substrate 101 in order to assist in the attachment of overlying structures to the carrier substrate 101. In an embodiment the adhesive layer 103 is a die attached film (DAF), such as an epoxy resin, a phenol resin, acrylic rubber, silica filler, or a combination thereof, and is applied using a lamination technique. However, any other suitable material and method of formation may be utilized.

The polymer layer 105 is initially formed over the adhesive layer 103. In an embodiment the polymer layer 105 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The polymer layer 105 may be formed through a process such as chemical vapor deposition (CVD), although any suitable process may be utilized, and may have a thickness between about 0.5 µm and about 5 µm, such as about 9.25 KÅ

Once the polymer layer 105 has been formed, underbump metallization layers 137 and the first redistribution layers 107 may be formed over the polymer layer 105. In an embodiment the underbump metallization layers 137 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the underbump metallization layers 137. Any suitable materials or layers of material that may be used for the underbump metallization layers 137 are fully intended to be included within the scope of the embodiments.

In an embodiment the underbump metallization layers 137 are created by forming each layer over the polymer layer 105. The forming of each layer may be performed using a plating process, such as electrochemical plating, although other processes of formation, such as sputtering, evaporation, or PECVD process, may alternatively be used depending upon the desired materials. The underbump metallization layers 137 may be formed to have a thickness of between about 0.7 µm and about 10 µm, such as about 5 µm.

In an embodiment the first redistribution layers 107 comprise a series of conductive layers 133 (such as two conductive layers) embedded within a series of dielectric layers 135 (such as three dielectric layers). In an embodiment, a first one of the series of dielectric layers 135 is formed over the polymer layer 105, and the first one of the series of dielectric layers 135 may be a material such as polybenzoxazole (PBO), although any suitable material, such as polyimide or a polyimide derivative, may be utilized. The first one of the series of dielectric layers 135 may be placed using, e.g., a spin-coating process, although any suitable method may be used.

After the first one of the series of dielectric layers 135 has been formed, openings may be made through the first one of the series of dielectric layers 135 by removing portions of the first one of the series of dielectric layers 135. The openings may be formed using a suitable photolithographic mask and etching process, although any suitable process or processes may be used to pattern the first one of the series of dielectric layers 135.

Once the first one of the series of dielectric layers 135 has been formed and patterned, a first one of the series of conductive layers 133 is formed over the first one of the series of dielectric layers 135 and through the openings formed within the first one of the series of dielectric layers 135. In an embodiment the first one of the series of conductive layers 133 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the first one of the series of conductive layers 133 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 5 µm. However, while the material and methods discussed are suitable to form the conductive material, these materials are merely exemplary. Any other suitable materials, such as AlCu or Au, and any other suitable processes of formation, such as CVD or PVD, may be used to form the first one of the series of conductive layers 133. Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Once the first one of the series of conductive layers 133 has been formed, a second one of the series of dielectric layers 135 and a second one of the series of conductive layers 133 may be formed by repeating steps similar to the first one of the series of dielectric layers 135 and the first one of the series of conductive layers 133. These steps may be repeated as desired in order to electrically connect each of the series of conductive layers 133 to an underlying one of the series of conductive layers 133, and may be repeated as often as desired until an uppermost one of the series of conductive layers 133 and an uppermost one of the series of dielectric layers 131 has been formed. In an embodiment the deposition and patterning of the series of conductive layers 133 and the series of dielectric layers 135 may be continued until the first redistribution layers 107 have a desired number of layers, such as two layers, although any suitable number of individual layers may be utilized.

Once the first redistribution layers 107 have been formed over the carrier substrate 101, the first TSVs 109 are formed in electrical connection with the first redistribution layers 107. In an embodiment the first TSVs 109 may be formed by initially forming a seed layer (not separately illustrated in FIG. 1A). In an embodiment the seed layer is a thin layer of a conductive material that aids in the formation of a thicker layer during subsequent processing steps. The seed layer may comprise a layer of titanium about 1,000 Å thick followed by a layer of copper about 5,000 Å thick. The seed layer may be created using processes such as sputtering, evaporation, or PECVD processes, depending upon the desired materials. The seed layer may be formed to have a thickness of between about 0.3 µm and about 1 µm, such as about 0.5 µm.

Once the seed layer has been formed, a photoresist (also not illustrated in FIG. 1A) is placed over the seed layer. In an embodiment the photoresist may be placed on the seed layer using, e.g., a spin coating technique to a height of between about 50 µm and about 250 µm, such as about 120 µm. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern. In an embodiment the pattern formed into the photoresist is a pattern for the first TSVs 109. The first TSVs 109 are formed in such a placement as to be located on different sides of subsequently attached devices such as the fingerprint sensor 104. However, any suitable arrangement for the pattern of first TSVs 109 may be utilized.

In an embodiment the first TSVs 109 are formed within the photoresist from one or more conductive materials, such as copper, tungsten, other conductive metals, or the like, and may be formed, for example, by electroplating, electroless plating, or the like. For example, an electroplating process is used wherein the seed layer and the photoresist are submerged or immersed in an electroplating solution. The seed layer surface is electrically connected to the negative side of an external DC power supply such that the seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the seed layer, acquires the dissolved atoms, thereby plating the exposed conductive areas of the seed layer within the opening of the photoresist.

Once the first TSVs 109 have been formed using the photoresist and the seed layer, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may be utilized. The removal of the photoresist may expose the underlying portions of the seed layer.

Once exposed a removal of the exposed portions of the seed layer may be performed. In an embodiment the exposed portions of the seed layer (e.g., those portions that are not covered by the first TSVs 109) may be removed by, for example, a wet or dry etching process. For example, in a dry etching process reactants may be directed towards the seed layer using the first TSVs 109 as masks. In another embodiment, etchants may be sprayed or otherwise put into contact with the seed layer in order to remove the exposed portions of the seed layer. After the exposed portion of the seed layer has been etched away, a portion of the first redistribution layers 107 is exposed between the first TSVs 109.

Once the first TSVs 109 have been formed, the fingerprint sensor 104 may be placed on the first redistribution layer 107. In an embodiment the fingerprint sensor 104 comprises a semiconductor substrate 111 with a face side 113 and a back side 115, and an array of electrodes 120 located adjacent to the face side 113. In an embodiment the semiconductor substrate 111 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Additionally, while not separately illustrated in FIG. 1A, the fingerprint sensor 104 may also comprise active devices and metallization layers in order to control and receive the input of signals from the array of electrodes 120 or else otherwise control the functionality and eventual output of the fingerprint sensor 104. In an embodiment the active devices for the fingerprint sensor 104 comprise a wide variety of active devices and passive devices such as capacitors, resistors, inductors and the like that may be used to generate the desired structural and functional requirements of the design for the fingerprint sensor 104. The active devices may be formed using any suitable methods either within or else on the semiconductor substrate 111.

The metallization layers are formed over the semiconductor substrate 111 and the active devices of the fingerprint sensor 104 and are designed to connect the various active devices to form functional circuitry. In an embodiment the metallization layers are formed of alternating layers of dielectric and conductive material and may be formed through any suitable process (such as deposition, damascene, dual damascene, etc.). In an embodiment there may be four layers of metallization separated from the second semiconductor substrate by at least one interlayer dielectric layer (ILD), but the precise number of metallization layers is dependent upon the design of the fingerprint sensor 104.

The array of electrodes 120 is electrically connected to the metallization layers of the fingerprint sensor 104 and is used to measure the difference in capacitance between different areas of an overlying finger in order to measure the fingerprint. In an embodiment the array of electrodes 120 comprises a conductive material such as aluminum or copper, and is formed using, e.g., a deposition and patterning process whereby a blanket layer of conductive material is deposited using a process such as CVD, PVD, ALD, or the like, and the blanket layer of material is then patterned using a photolithographic masking and etching process. However, any suitable material or method of manufacture may be utilized to form the array of electrodes 120.

Additionally, while the formation of the array of electrodes 120 has been described using a blanket deposition followed by a subsequent patterning and protection, this process is merely intended to be illustrative and is not intended to be limiting. Rather, any suitable process of manufacturing the array of electrodes 120, such as using a damascene or dual damascene process, may also be used. All such processes are fully intended to be included within the scope of the embodiments.

Contact pads 119 are formed to provide an electrical connection to a subsequently formed second redistribution layer 121 (not illustrated in FIG. 1A but illustrated and described below with respect to FIG. 1B). In an embodiment the contact pads 119 are formed of a conductive material such as aluminum, although other suitable materials, such as copper, tungsten, or the like, may be utilized. The contact pads 119 may be formed using a process such as CVD or PVD, although other suitable materials and methods may be utilized. Once the material for the contact pads 119 has been deposited, the material may be shaped into the contact pads 119 using, e.g., a photolithographic masking and etching process.

Once the contact pads 119 have been formed, a first protective layer 122 may be placed and patterned. In an embodiment the first protective layer 122 may be a protective material such as polybenzoxazole (PBO) or polyimide (PI), silicon oxide, silicon nitride, silicon oxynitride, benzocyclobutene (BCB), or any other suitable protective material. The first protective layer 122 may be formed using a method such as a spin-on process, a deposition process (e.g., chemical vapor deposition), or other suitable process based upon the chosen material, and may be formed to a thickness of between about 1 μm and about 100 μm, such as about 20 μm.

Once formed, the first protective layer 122 is patterned to form openings and expose the contact pads 119. In an embodiment the first protective layer 122 may be patterned using, e.g., a photolithographic masking and etching process. In such a process, a photoresist (not individually illustrated in FIG. 1B) is applied to the first protective layer 122 and then exposed to a patterned light source. The light source will impinge upon the photoresist and induce a change in a property of the photoresist, which is then utilized to selectively remove either the exposed portion or the unexposed portion and expose the first protective layer 122. The photoresist is then utilized as a mask during, e.g., an etching process which removes portions of the first protective layer 122 to expose the contact pads 119. Once the first protective layer 122 has been patterned, the photoresist may be removed using, e.g., an ashing process.

In another embodiment the first protective layer 122 may be thinned in order to expose the contact pads 119. In this embodiment a planarization process such as a chemical mechanical polishing process, whereby chemicals and abrasives are applied to the first protective layer 122 while a polishing pad grinds away material, may be utilized to remove the material of the first protective layer 122 from over the contact pads 119, thereby exposing the contact pads 119 while also planarizing the first protective layer 122 with the contact pads 119. Any suitable method of forming the contact pads 119 and the first protective layer 122 may be used.

The fingerprint sensor 104 is placed on the first redistribution layer 107 between the first TSVs 109 using, e.g., a second adhesive layer 112. In an embodiment the second adhesive layer 112 may be a similar material and applied in a similar fashion as the adhesive layer 103, although any suitable material may be used. The fingerprint sensor 104 is placed face up such that the face side 113 is facing away from the carrier substrate 101. Additionally, the contact pads 119 are connected to the array of electrodes 120 and the metallization layers of the fingerprint sensor 104 on the face side 113 of the fingerprint sensor 104.

Figure 1B:
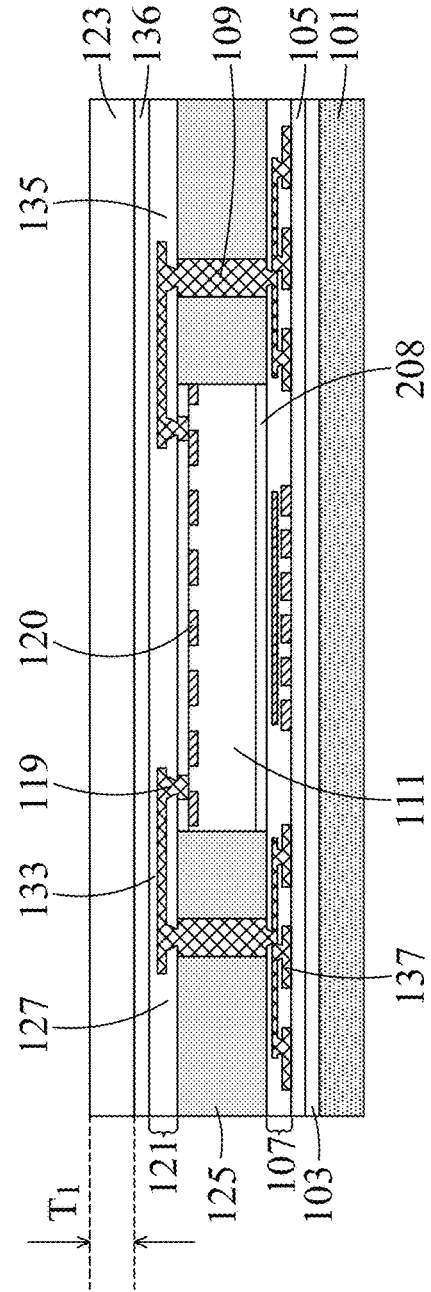

FIG. 1B illustrates an encapsulation of the fingerprint sensor 104 and the first TSVs 109 with an encapsulant 125. In an embodiment the encapsulant 125 may be a molding compound and may be placed using a molding device (not illustrated in FIG. 1B). For example, the fingerprint sensor 104 may be placed within a cavity of the molding device, and the cavity may be hermetically sealed. The encapsulant 125 may be placed within the cavity either before the cavity is hermetically sealed or else may be injected into the cavity through an injection port. In an embodiment the encapsulant 125 may be a molding compound resin such as polyimide, PPS, PEEK, PES, a heat resistant crystal resin, combinations of these, or the like.

Once the encapsulant 125 has been placed into the cavity such that the encapsulant 125 encapsulates the region around the fingerprint sensor 104 and the first TSVs 109, the encapsulant 125 may be cured in order to harden the encapsulant 125 for optimum protection. While the exact curing process is dependent at least in part on the particular material chosen for the encapsulant 125, in an embodiment in which molding compound is chosen as the encapsulant 125, the curing could occur through a process such as heating the encapsulant 125 to between about 100° C. and about 130° C., such as about 125° C. for about 60 sec to about 3000 sec, such as about 600 sec. Additionally, initiators and/or catalysts may be included within the encapsulant 125 to better control the curing process.

However, as one having ordinary skill in the art will recognize, the curing process described above is merely an exemplary process and is not meant to limit the current embodiments. Other curing processes, such as irradiation or even allowing the encapsulant 125 to harden at ambient temperature, may be used. Any suitable curing process may be used, and all such processes are fully intended to be included within the scope of the embodiments discussed herein.

FIG. 1B additionally illustrates a thinning of the encapsulant 125 in order to expose the contact pads 119 of the fingerprint sensor 104. In an embodiment the thinning may be performed, e.g., using a mechanical grinding or chemical mechanical polishing (CMP) process whereby chemical etchants and abrasives are utilized to react and grind away the encapsulant 125. The encapsulant 125 may be thinned until the contact pads 119 have been exposed.

However, while the CMP process described above is presented as one illustrative embodiment, it is not intended to be limiting to the embodiments. Any other suitable removal process may be used to encapsulate the fingerprint sensor 104 while exposing the contact pads 119. For example, a chemical etch or a series of chemical etches may be utilized, or an encapsulation process that does not cover the contact pads 119 may be utilized. These processes and any other suitable process may be utilized to apply the encapsulant 125, and all such processes are fully intended to be included within the scope of the embodiments.

FIG. 1B also illustrates a formation of a second redistribution layer 121 in order to electrically interconnect the first TSVs 109 with the contact pads 119 of the fingerprint sensor 104. In an embodiment the second redistribution layer 121 may be similar to the first redistribution layer 107 described above with respect to FIG. 1A. In a particular embodiment, there may be a single one of the series of conductive layers 133 sandwiched between two of the series of dielectric layers 135. However, any suitable combination of conductive layers and dielectric layers may be utilized to interconnect the contact pads 119 of the fingerprint sensor 104 with the first TSVs 109.

Once the second redistribution layer 121 has been formed, a sensor surface material 123 may be attached to the second redistribution layer 121 using, e.g., an interface layer 136, such as a glue layer or a color film layer. In an embodiment the sensor surface material 123 may be attached by initially applying the interface layer 136 to the second redistribution layer 121 and then applying the sensor surface material 123 to the interface layer 136. The interface layer 136 may be similar to the adhesive layer 103 described above with respect to FIG. 1A, although any suitable material may be used.

In an embodiment the sensor surface material 123 is a material such as sapphire or glass that allows for the measurement of capacitive changes between the fingerprint sensor 104 and an overlying finger to determine contours of a fingerprint on the finger. In an embodiment the sensor surface material 123 may be placed using a physical placing process. Additionally, the sensor surface material 123 may have a first thickness $T_1$ of between about 50 μm and about 1000 μm, such as about 100 μm. However, any suitable material and thickness may be utilized.

In another embodiment in which the interface layer 136 is a color film layer, the sensor surface material may be omitted. For example, in a particular embodiment the interface layer 136 may be placed over the second redistribution layer 121 by itself, without then placing the sensor surface material onto the interface layer 136. Any suitable combination of materials may be utilized.

FIG. 1C illustrates a debonding of the carrier substrate 101 and a patterning of the polymer layer 105 in order to expose the underbump metallization layers 137. In an embodiment the carrier substrate 101 may be debonded by initially bonding the sensor surface material 123 to, e.g., a ring structure 152. The ring structure 152 may be a metal ring intended to provide support and stability for the structure during and after the debonding process. In an embodiment the sensor surface material 123 may be attached to the ring structure 152 using, e.g., a ultraviolet tape 154, although any other suitable adhesive or attachment may be used.

Once attached, the carrier substrate 101 may be debonded from the structure using, e.g., a thermal process to alter the adhesive properties of the adhesive layer 103. In a particular embodiment an energy source such as an ultraviolet (UV) laser, a carbon dioxide ($CO_2$) laser, or an infrared (IR) laser, is utilized to irradiate and heat the adhesive layer 103 until the adhesive layer 103 loses at least some of its adhesive properties. Once performed, the carrier substrate 101 and the adhesive layer 103 may be physically separated and removed from the structure comprising the fingerprint sensor 104 and the sensor surface material 123.

Once debonded, the polymer layer 105 is patterned in order to expose the underlying underbump metallization layers 137. In an embodiment the polymer layer 105 may be patterned using, e.g., a laser drilling method. In such a method a protective layer, such as a light-to-heat conversion (LTHC) layer or a hogomax layer (not separately illustrated in FIG. 1C) is first deposited over the polymer layer 105. Once protected, a laser is directed towards those portions of the polymer layer 105 which are desired to be removed in order to expose the underlying underbump metallization layers 137. During the laser drilling process the drill energy may be in a range from 0.1 mJ to about 30 mJ, and a drill angle of about 0 degree (perpendicular to the polymer layer 105) to about 85 degrees to normal of the polymer layer 105. In an embodiment the patterning may be formed to form openings over the underbump metallization layers 137 to have a width of between about 100 µm and about 300 µm, such as about 200 µm.

In another embodiment, the polymer layer 105 may be patterned by initially applying a photoresist (not individually illustrated in FIG. 1C) to the polymer layer 105 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 105 are removed with, e.g., a dry etch process. However, any other suitable method for patterning the polymer layer 105 may be utilized.

FIG. 1D illustrates that, once the polymer layer 105 has been patterned to expose the underbump metallization layers 137, a high voltage chip 141 may be bonded to the underbump metallization layers 137 through the polymer layer 105 to form a first sensor package 149. In an embodiment the high voltage chip 141 is designed and connected in order to supply a high voltage, such as between about 5 V and about 50 V, such as about 33 V, to the fingerprint sensor 104 in order to amplify the sensor's sensitivity. For example, by integrating the high voltage chip 141 with the fingerprint sensor 104 such that a high voltage can be supplied to the fingerprint sensor 104, the sensitivity of the fingerprint sensor 104 may be increased ten times by raising the input voltage to 33 V from, e.g., 3.3 V.

In an embodiment the high voltage chip 141 may comprise a second semiconductor substrate (not separately illustrated), active devices (not separately illustrated), metallization layers (not separately illustrated) utilized to interconnect the active devices of the high voltage chip 141, and first external connections 143 in order to interconnect the high voltage chip 141 to the fingerprint sensor 104. The second semiconductor substrate may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices for the high voltage chip 141 comprise a wide variety of active devices and passive devices such as capacitors, resistors, inductors and the like that may be used to generate the desired structural and functional requirements of the design for the high voltage chip 141. The active devices may be formed using any suitable methods either within or else on the second semiconductor substrate.

The metallization layers for the high voltage chip 141 are formed over the second semiconductor substrate and the active devices of the high voltage chip 141 and are designed to connect the various active devices to form functional circuitry. In an embodiment the metallization layers are formed of alternating layers of dielectric and conductive material and may be formed through any suitable process (such as deposition, damascene, dual damascene, etc.). In an embodiment there may be four layers of metallization separated from the second semiconductor substrate by at least one interlayer dielectric layer (ILD), but the precise number of metallization layers is dependent upon the design of the high voltage chip 141.

The first external connections 143 may be formed to interconnect the high voltage chip 141 to the fingerprint sensor 104 and may be, for example, contact bumps, although any suitable connection may be utilized. In an embodiment in which the first external connections 143 are contact bumps, the first external connections 143 may comprise a material such as tin, or other suitable materials, such as silver, lead-free tin, or copper. In an embodiment in which the first external connections 143 are tin solder bumps, the first external connections 143 may be formed by initially forming a layer of tin through such commonly used methods such as evaporation, electroplating, printing, solder transfer, ball placement, etc, to a thickness of, e.g., between about 30 µm and about 100 µm. Once a layer of tin has been formed on the structure, a reflow may be performed in order to shape the material into the desired bump shape.

The high voltage chip 141 may be formed to have a first width $W_1$ of between about 1 mm and about 5 mm, such as about 1.5 mm, and may also be formed to have a second thickness $T_2$ of between about 70 µm and about 150 µm, such as about 100 µm. Additionally, while not shown in FIG. 1D because it would extend into and out of the figure, the high voltage chip 141 may also be formed to have a first length of between about 1 mm and about 5 mm, such as about 2 mm. However, any suitable dimensions may be utilized for the high voltage chip 141.

The high voltage chip 141 may be connected to the underbump metallization layers 137, for example, by initially applying a solder paste to the exposed underbump metallization layers 137 and then flip chip bonding the high voltage chip 141 to the underbump metallization layers 137. In an embodiment the high voltage chip 141 may be bonded by sequentially dipping the first external connections 143 of the high voltage chip 141 into flux, and then using a pick-and-place tool in order to physically align the first external connections 143 of the high voltage chip 141 with individual ones of the underbump metallization layers 137. In an embodiment in which the first external connections 143 are solder balls, once the high voltage chip 141 has been placed a reflow process may be performed in order to physically bond the high voltage chip 141 with the underlying underbump metallization layers 137 and a flux clean may be performed. However, any other suitable connector or connection process may be utilized, such as metal-to-metal bonding or the like.

Once the high voltage chip 141 has been bonded to the underbump metallization layers 137, an underfill material 147 may be placed between the high voltage chip 141 and the fingerprint sensor 104 in order to help protect and isolate the devices. In an embodiment the underfill material 147 is a protective material used to cushion and support the high voltage chip 141 from operational and environmental degradation, such as stresses caused by the generation of heat during operation. The underfill material 147 may comprise, for example, a liquid epoxy or other protective material, and then cured to harden and may be dispensed by, e.g., injection.

Additionally, after the first polymer layer 105 has been patterned, second external connections 139 may be utilized to provide an external connection point for electrical connection to the first redistribution layer 107 and may be, for example, a contact bump as part of a ball grid array (BGA), although any suitable connection may be utilized. In an embodiment in which the second external connections 139 are contact bumps, the second external connections 139 may comprise a material such as tin, or other suitable materials, such as silver, lead-free tin, or copper. In an embodiment in which the second external connections 139 are tin solder bumps, the second external connections 139 may be formed by initially forming a layer of tin through such commonly used methods such as evaporation, electroplating, printing, solder transfer, ball placement, etc, to a thickness of, e.g., about 250 μm. Once a layer of tin has been formed on the structure, a reflow may be performed in order to shape the material into the desired bump shape.

Figure 1E:
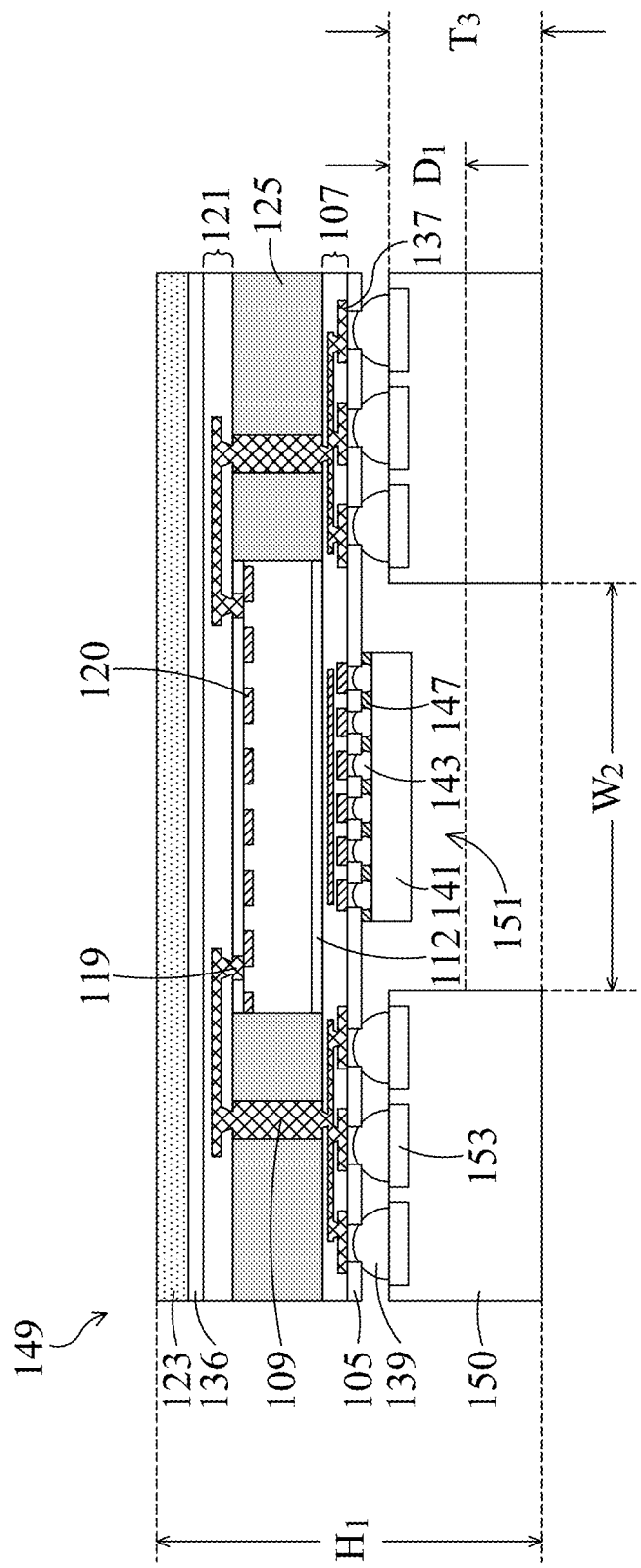

FIG. 1E illustrates a bonding of the structure to a substrate 150. In an embodiment the substrate 150 may be, e.g., a printed circuit board that works to interconnect various electrical components to each other in order to provide a desired functionality for a user. Alternatively, the substrate 150 may be a flexible substrate or comprise multiple conductive layers (not individually illustrated) which may be etched into traces of various widths and lengths and connected through inter-layer vias. Together, the lines and vias may form an electrical network to route DC power, ground, and signals from one side of the substrate 150 to the other. Those of skill in the art will recognize that the substrate 150 may be fabricated from an organic (laminate) material such as bismaleimide-triazine (BT), a polymer-based material such as liquid-crystal polymer (LCP), a ceramic material such as low-temperature co-fired ceramic (LTCC), a silicon or glass interposer, or the like. Those of skill in the art will also recognize that the conductive layers and vias may be formed from any suitable conductive material, such as copper, aluminum, silver, gold, other metals, alloys, combination thereof, and/or the like, and formed by any suitable technique, such as electro-chemical plating (ECP), electroless plating, other deposition methods such as sputtering, printing, and chemical vapor deposition (CVD) methods, or the like. The substrate 150 may be formed or acquired with a third thickness $T_3$ of between about 100 μm and about 1000 μm, such as about 200 μm, although any suitable thickness may be utilized.

In some embodiments, the substrate 150 may also include electrical elements, such as resistors, capacitors, signal distribution circuitry, combinations of these, or the like. These electrical elements may be active, passive, or a combination thereof. In other embodiments, the substrate 150 is free from both active and passive electrical elements therein. All such combinations are fully intended to be included within the scope of the embodiments.

Additionally, in order to accommodate the presence of the high voltage chip 141, the substrate 150 may be formed with, or have formed therein, a first opening 151. In an embodiment the first opening 151 is sized in order to accommodate the high voltage chip 141 and, as such, the dimensions of the first opening 151 are dependent at least in part upon the dimensions of the high voltage chip 141. However, in an embodiment in which the high voltage chip 141 has the first width $W_1$, the first length, and the second thickness $T_2$, the first opening 151 may be formed to have a second width $W_2$ of between about 2 mm and about 6 mm, such as about 2.5 mm. Additionally, the first opening 151 may have a second length (not separately illustrated in FIG. 1E as the second length will extend into and out of the figure) of between about 2 mm and about 6 mm, such as about 3.5 mm. However, any suitable dimensions that accommodate the high voltage chip 141 may be utilized.

Additionally, in some embodiments, and as illustrated in FIG. 1E, the first opening 151 will extend all of the way through the substrate 150. As such, the first opening 151 will have the third thickness $T_3$ of the substrate 150, such as by being between about 0.1 mm and about 1 mm, such as about 0.2 mm. However, any suitable dimension may be used.

In another embodiment (illustrated in FIG. 1E by the dashed lines), the first opening 151 may be formed to extend partially, but not fully, through the substrate 150. In this embodiment, the first opening 151 may be formed to extend into the substrate 150 a first depth $D_1$ of between about 50 μm and about 500 μm, such as about 100 μm. However, any suitable depth may be utilized to accommodate the high voltage chip 141.

The substrate 150 may further comprise second contact pads 153 that allow for electrical connection with the second external connections 139. In an embodiment the second contact pads 153 may be formed from similar materials and using similar processes as the contact pads 119 described above with respect to FIG. 1A. For example, the second contact pads 153 may be aluminum contact pads formed using a process such as CVD or PVD. However, any suitable material or method of manufacturing the second contact pads 153 may be used.

In order to bond the second contact pads 153 with the second external connections 139, the second contact pads 153 and the second external connections 139 are first aligned with each other. For example, in an embodiment the second external connections 139 may be aligned and placed into physical contact with the second contact pads 153. Once in place and aligned, the second external connections 139 may be reflowed in order to physically and electrically bond the second external connections 139 to the substrate 150.

By attaching the fingerprint sensor 104 to the substrate 150 such that the high voltage chip 141 is located within the first opening 151, the overall height of the structure may be reduced. For example, in an embodiment the overall height of the substrate 150 along with the attached fingerprint sensor 104 may be a first height $H_1$ of between about 0.4 mm and about 1.5 mm, such as about 0.5 mm. However, any suitable height may be utilized.

Figure 1F:
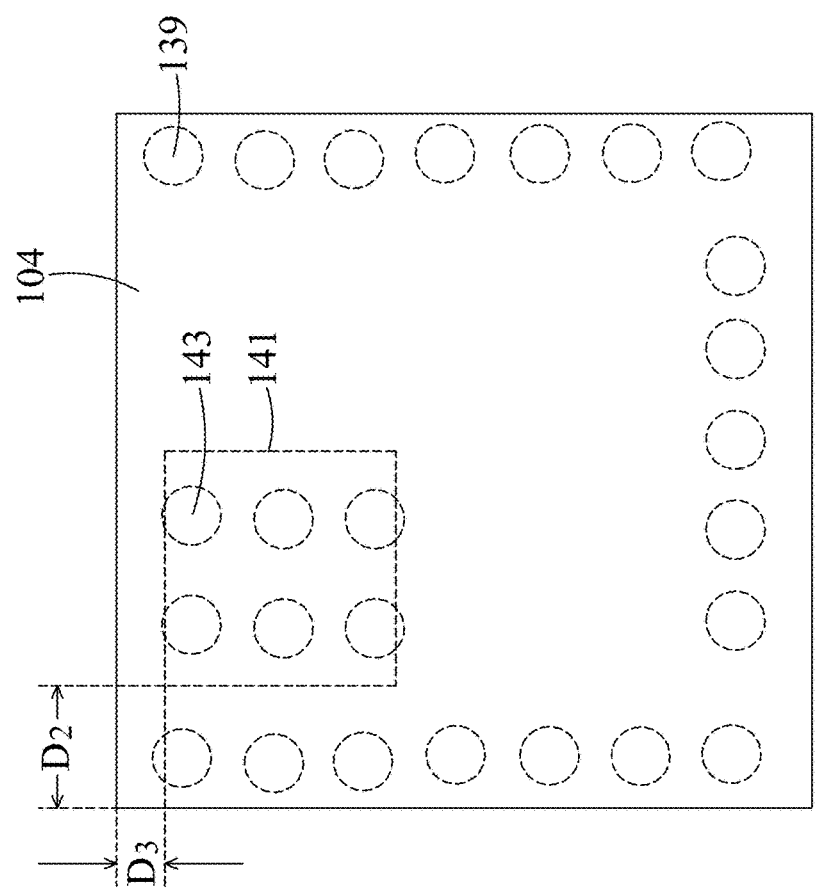

FIG. 1F illustrates another embodiment in which the high voltage chip 141, instead of being centered below the fingerprint sensor 104, may be located as desired with respect to the fingerprint sensor 104. For example, in the embodiment illustrated in FIG. 1F, the high voltage chip 141 may be located a second distance $D_2$ from a first side of the fingerprint sensor 104 (in this top down view) of between about 80 μm and about 4000 μm, such as about 1000 μm, and also located a third distance $D_3$ from a second side of the fingerprint sensor 104 of between about 80 μm and about 4000 μm, such as about 1500 μm. However, any suitable placement of the high voltage chip 141 relative to the fingerprint sensor 104 may be utilized.

By forming the first sensor package 149 as described above, not only can the sensitivity of the fingerprint sensor 104 be enhanced by minimizing the sensing gap between the array of electrodes 120 and the finger, but a fan-in with through vias is used to integrate the high voltage chip 141 and increase charge (Q=C×V). Such an increase allows for an increase in the sensitivity of the sensor.

Figure 2A:
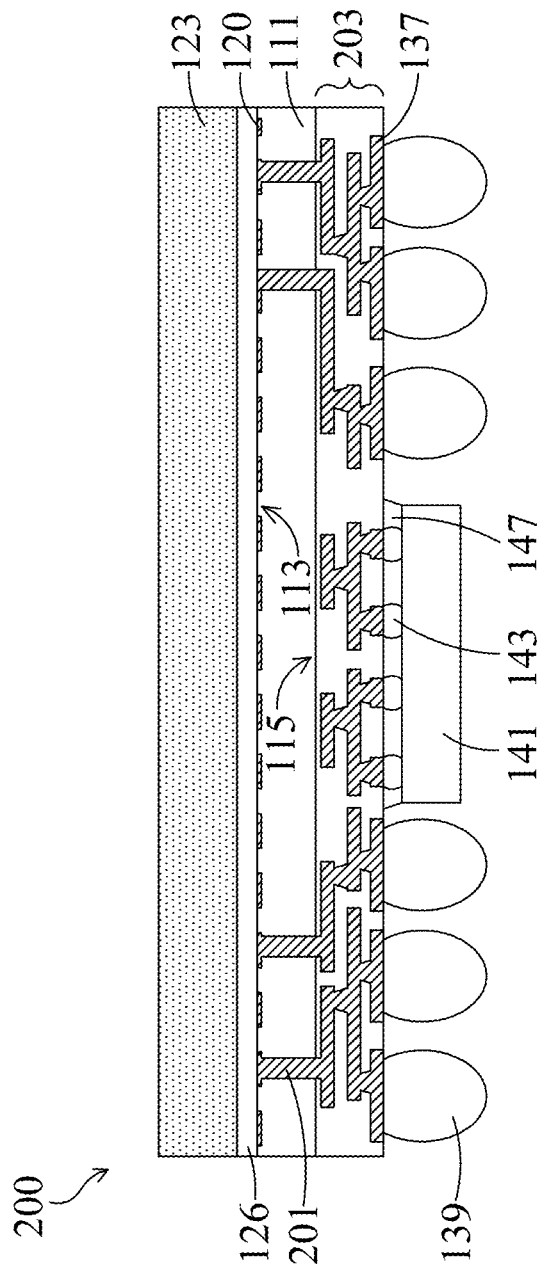
FIGS. 2A-2B illustrate an embodiment which uses through vias extending through the fingerprint sensor in connection with a redistribution layer in accordance with some embodiments.

FIG. 2A illustrates another embodiment that illustrates a second sensor package 200 that uses through substrate vias 201 that extend through the semiconductor substrate 111 in order to connect the array of electrodes 120 and a third redistribution layer 203. In this embodiment, however, the through substrate vias 201 are utilized to electrically connect the array of electrodes 120 and the metallization layers which are located on the face side 113 of the fingerprint sensor 104 to the back side 115 of the fingerprint sensor 104. The through substrate vias 201 may be formed by initially applying and developing a suitable photoresist to the semiconductor substrate 111 prior to the formation of the metallization layers, and then etching the semiconductor substrate 111 to generate TSV openings. The openings for the through substrate vias 201 at this stage may be formed so as to extend into the semiconductor substrate 111 to a depth at least greater than the eventual desired height of the finished semiconductor substrate 111.

Once the openings for the through substrate vias 201 have been formed, the openings for the through substrate vias 201 may be filled with, e.g., a barrier layer and a conductive material. The barrier layer may comprise a conductive material such as titanium nitride, although other materials, such as tantalum nitride, titanium, a dielectric, or the like may be utilized. The barrier layer may be formed using a CVD process, such as PECVD. However, other processes, such as sputtering or metal organic chemical vapor deposition (MOCVD), may be used. The barrier layer may be formed so as to contour to the underlying shape of the opening for the through substrate vias 201.

The conductive material may comprise copper, although other suitable materials such as aluminum, alloys, doped polysilicon, combinations thereof, and the like, may be utilized. The conductive material may be formed by depositing a seed layer and then electroplating copper onto the seed layer, filling and overfilling the openings for the through substrate vias 201. Once the openings for the through substrate vias 201 have been filled, excess barrier layer and excess conductive material outside of the openings for the through substrate vias 201 may be removed through a grinding process such as chemical mechanical polishing (CMP), although any suitable removal process may be used.

Once the conductive material is within the openings for the through substrate vias 201, a thinning of the semiconductor substrate 111 may be performed in order to expose the openings for the through substrate vias 201 and form the through substrate vias 201 from the conductive material that extends through the semiconductor substrate 111. In an embodiment, the thinning of the semiconductor substrate 111 may be performed by a planarization process such as CMP or etching, leaving the through substrate vias 201 planar with the semiconductor substrate 111.

However, as one of ordinary skill in the art will recognize, the above described process for forming the through substrate vias 201 is merely one method of forming the through substrate vias 201, and other methods are also fully intended to be included within the scope of the embodiments. For example, forming the openings for the through substrate vias 201, filling the openings for the through substrate vias 201 with a dielectric material, thinning the semiconductor substrate 111 to expose the dielectric material, removing the dielectric material, and filling the openings for the through substrate vias 201 with a conductor may also be used. This and all other suitable methods for forming the through substrate vias 201 into the semiconductor substrate 111 are fully intended to be included within the scope of the embodiments.

Once the through substrate vias 201 have been formed (and the active devices and metallization layers have been also been completed as desired), the third redistribution layer 203 may be formed in electrical connection with the through substrate vias 201 in order to provide interconnectivity between the through substrate vias 201 and, e.g., the high voltage chip 141 and the second external connections 139. In an embodiment the third redistribution layer 203 may be formed with similar materials and using similar processes as described above with respect to the first redistribution layer 107. For example, the third redistribution layer 203 may be formed of multiple layers of conductive and dielectric materials formed using deposition and photolithographic masking and etching processes. However, any suitable materials or methods of formation may be utilized to form the third redistribution layer 203.

Once the third redistribution layer 203 has been formed, the high voltage chip 141 may be bonded to the third redistribution layer 203, and the second external connections 139 may be placed to be in electrical connection with the third redistribution layer 203. In an embodiment the high voltage chip 141 and the second external connections 139 may be formed or placed as described above with respect to FIG. 1D. For example, the high voltage chip 141 may be bonded to the third redistribution layer 203 and the first external connections 129 may be placed and reflowed.

Additionally, before or after the high voltage chip 141 and the first external connections 129 have been formed or placed, the sensor surface material 123 may be attached to the fingerprint sensor 104 using, e.g., the interface layer 136. In an embodiment the sensor surface material 123 may be attached with the interface layer 136 as described above with respect to FIG. 1B. For example, the interface layer 136 may be physically contacted to both the sensor surface material 123 and the fingerprint sensor 104. However, any suitable method of attaching the sensor surface material 123 may be utilized.

Figure 2B:
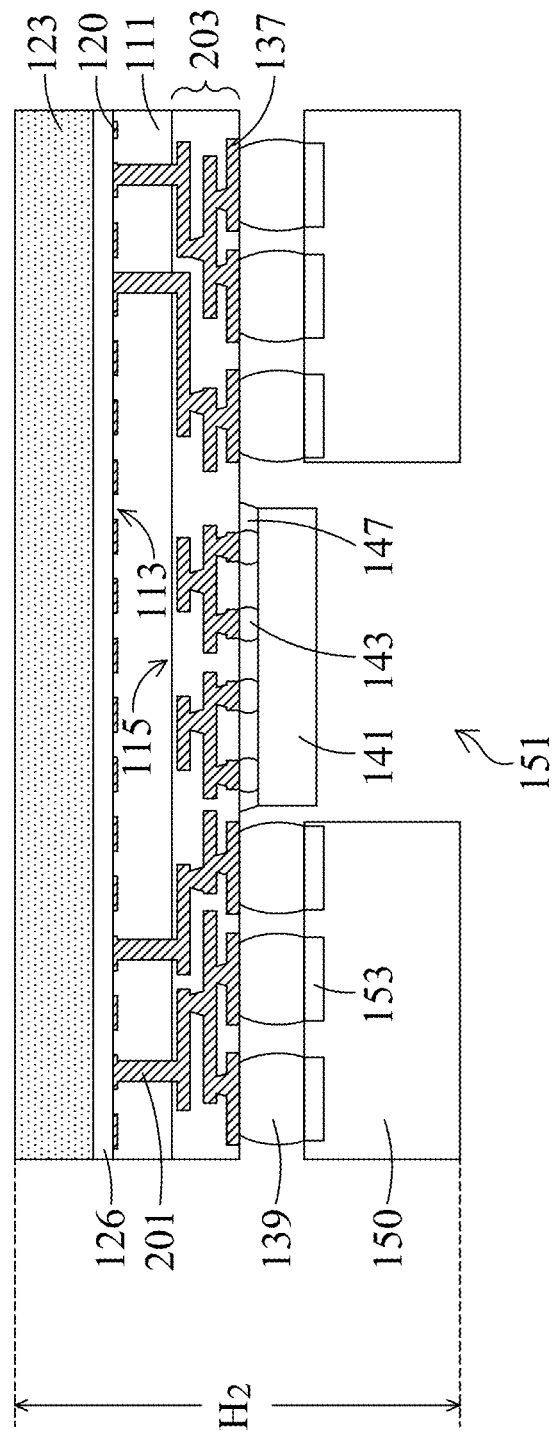

FIG. 2B illustrates an attachment of the substrate 150 to the second sensor package 200. In an embodiment the second sensor package 200 is bonded to the substrate 150 as described above with respect to FIG. 1E. For example, the second external connections 139 are aligned with the second contact pads 153, and a reflow process is performed to electrically and physically bond the second external connections 139 with the second contact pads 153. However, any suitable method of bonding the second sensor package 200 with the substrate 150 may be utilized.

Additionally, during the bonding process the high voltage chip 141 is aligned with and inserted within the first opening 151 that is located within (or through) the substrate 150. In an embodiment the first opening 151 is formed or located so as to accept the high voltage chip 141 and allowing the overall height of the combined substrate 150 and second sensor package 200 to be reduced. For example, the overall height of the structure in this embodiment may be reduced to a second height $H_2$ of between about 370 μm and about 1500 μm, such as about 400 μm. However, any suitable height may be utilized.

By forming the third redistribution layer 203 along with the through substrate vias 201 as described, the through substrate vias 201 and the third redistribution layer 203 may be used to output a redistributed signal from the fingerprint sensor 104. Additionally, with the inclusion of the substrate 150 and the first opening 151 within the substrate 150, a flexible SMT process with the high voltage chip 141 inside the first opening 151 may be achieved.

Figure 3A:
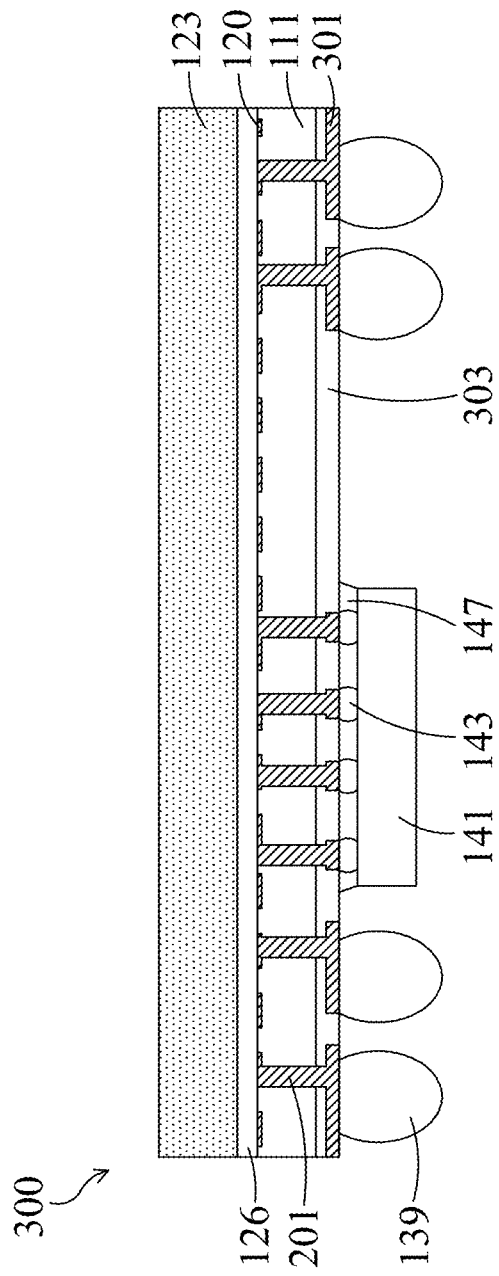
FIGS. 3A-3B illustrate an embodiment which uses through vias extending through the fingerprint sensor without a redistribution layer in accordance with some embodiments.
Figure 3B:
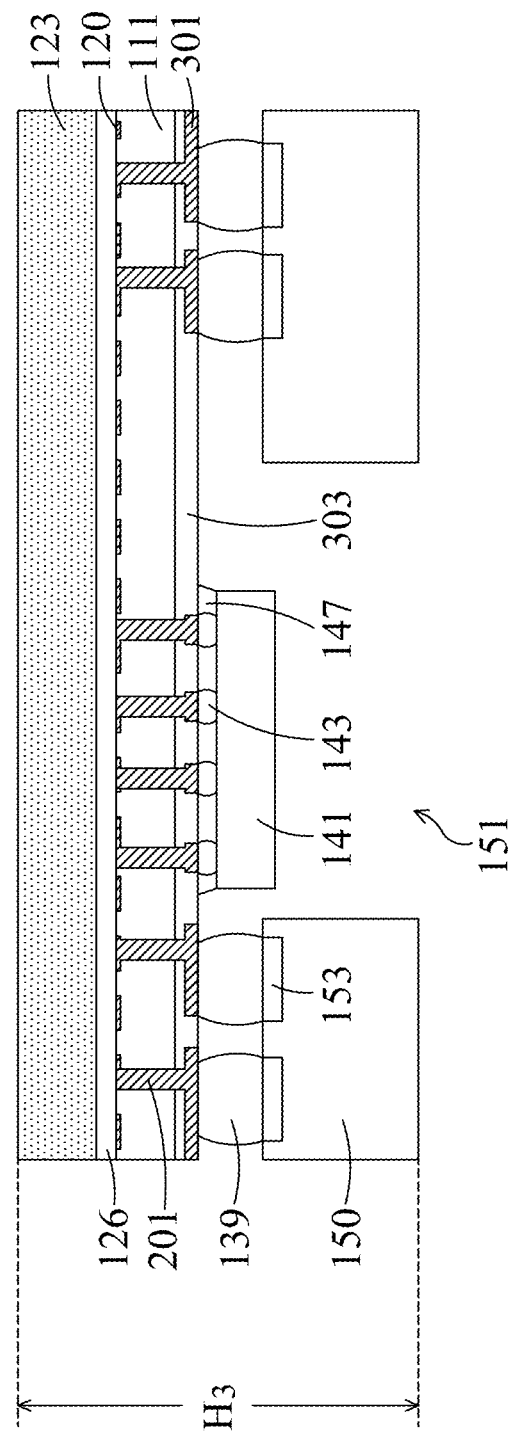

FIGS. 3A-3B illustrate another embodiment in which the through substrate vias 201 are formed in electrical connection with the second external connections 139 and the high voltage chip 141 without the use of the third redistribution layer 203 to form a third sensor package 300. In this embodiment, instead of forming the third redistribution layer 203 on the back side 115 of the semiconductor substrate 111, third contact pads 301 are formed directly over and in physical and/or electrical connection with the through substrate vias 201. In an embodiment the third contact pads 301 may be formed using similar materials and processes as described above with respect to the contact pads 119. For example, the third contact pads 301 may be formed from aluminum using a deposition and patterning process. However, any suitable process for forming the third contact pads 301 may be utilized.

Once the third contact pads 301 have been formed, a second protective layer 303 may be formed over the third contact pads 301. In an embodiment the second protective layer 303 may be a protective material such as polybenzoxazole (PBO) or polyimide (PI), silicon oxide, silicon nitride, silicon oxynitride, benzocyclobutene (BCB), or any other suitable protective material. The second protective layer 303 may be formed using a method such as a spin-on process, a deposition process (e.g., chemical vapor deposition), or other suitable process based upon the chosen material, and may be formed to a thickness of between about 1 µm and about 100 µm, such as about 20 µm. Once in place, the second protective layer 303 may be patterned in order to expose the third contact pads 301.

Once the third contact pads 301 have been formed, the sensor surface material 123 may be placed over the fingerprint sensor 104, the high voltage chip 141 may be bonded to the third contact pads 301, and the second external connections 139 may be placed to be in electrical connection with the third contact pads 301. In an embodiment the sensor surface material 123, the high voltage chip 141 and the second external connections 139 may be formed or placed as described above with respect to FIGS. 1B-1D. For example, the sensor surface material 123 may be adhered with the second glue layer 126, the high voltage chip 141 may be bonded to the third contact pads 301 and the first external connections 129 may be placed and reflowed.

FIG. 3B illustrates an attachment of the substrate 150 to the third sensor package 300. In an embodiment the third sensor package 300 is bonded to the substrate 150 as described above with respect to FIG. 1E. For example, the second external connections 139 are aligned with the second contact pads 153, and a reflow process is performed to electrically and physically bond the second external connections 139 with the second contact pads 153. However, any suitable method of bonding the third sensor package 300 with the substrate 150 may be utilized.

Additionally, during the bonding process the high voltage chip 141 is aligned with and inserted within the first opening 151 that is located within (or through) the substrate 150. In an embodiment the first opening 151 is formed or located so as to accept the high voltage chip 141 and allowing the overall height of the combined substrate 150 and third sensor package 300 to be reduced.

By bonding the high voltage chip 141 directly over the through substrate vias 201, the processing steps that are used to form the third redistribution layer 203 may be avoided, allowing for a simpler and less complicated manufacturing process. Additionally, by not manufacturing the third redistribution layer 203, the overall height of the structure without the third redistribution layer 203 may be reduced. For example, in an embodiment the overall structure may have a third height $H_3$ of between about 360 µm and about 1500 µm, such as about 390 µm. However, any suitable height may be utilized.

Figure 4:
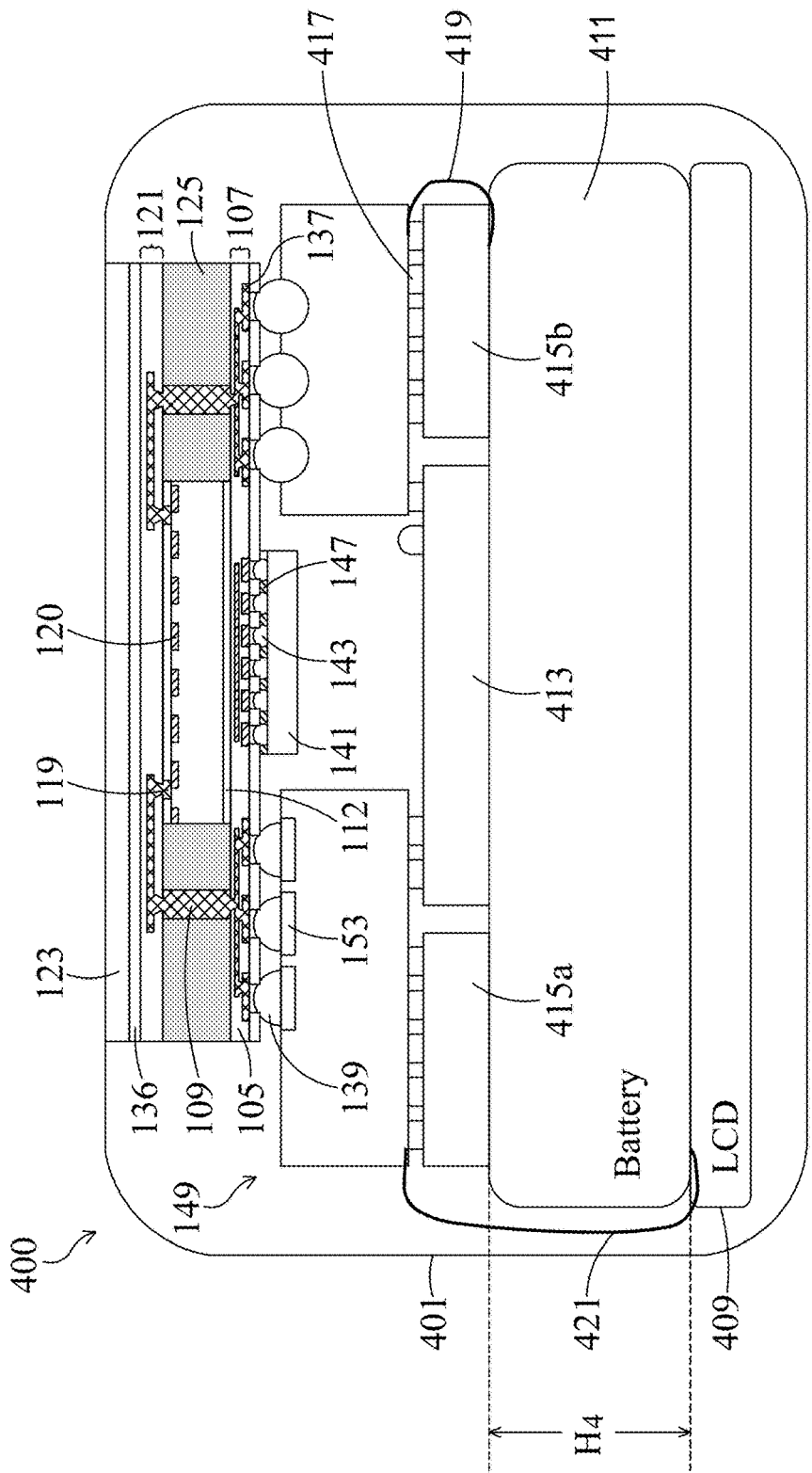
FIG. 4 illustrates an incorporation of the fingerprint sensor package into a semiconductor device in accordance with some embodiments.

FIG. 4 illustrates an embodiment in which the substrate 150 and the first sensor package 149 are incorporated into, e.g., a semiconductor device structure 400 with the first sensor package 149 located at a first side of the semiconductor device structure 400 and a display device 409 located at a second side opposite the first side. In an embodiment the semiconductor device structure 400 includes a multi-chip package system (MCPS) 413 with the fingerprint sensor 104 attached to THE MCPS 413 through the substrate 150, with the substrate 150 being bonded to the MCPS 413 through, e.g., connectors 417, such as solder bumps, although any suitable connector may be utilized.

In some embodiments, other electrical components 415a and 415b in additional to the MCPS 413 are also attached to the substrate 150 by the connectors 417. The electric components 415a and 415b may be similar to or different from each other. As an example, the electrical component 415a may be a semiconductor die or a semiconductor package, and the electric component 415b may be a discrete electrical component, e.g., a passive or active device such as a capacitor, inductor, resistor, transistor, diode, or the like. One skilled in the art will appreciate that FIG. 4 is just an illustration, as different numbers of the MCPS 413 and the electrical components 415a/415b could be used in conjunction with the fingerprint sensor 104 without departing from the spirit of the current disclosure.

As illustrated in FIG. 4, a battery 411 is electrically coupled to the substrate 150 by a cable 419, with the MCPS 413 disposed between the battery 411 and the substrate 150. In some embodiments, the cable 419 is a flexible cable, such as a flexible printed circuit (FPC) cable. The display device 409, such as an LCD display device, is disposed next to battery 411, with battery 411 being disposed between the MCPS 413 and the display device 409. The display device 409 is electrically coupled to the substrate 150 by a cable 421, such as an FPC cable, in some embodiments.

Additionally, the semiconductor device structure 400 has a housing 401, in accordance with some embodiments. In some embodiments, semiconductor device structure 400 comprises a wearable device, such as a smart watch, a fitness device, or a health monitoring device.

By attaching the first sensor package 149 to the substrate 150 as described, and incorporating the structure into the semiconductor device structure 400, the thickness of the individual components may be reduced, allowing for a larger sized battery 411 to be used. For example, in an embodiment the height of the battery 411 may be increased to have a fourth height $H_4$ of between about 3 mm and about 7 mm, such as about 5 mm. By increasing the size of the battery 411 without increasing the size of the structure, a semiconductor device may run for a longer period of time between recharges.

Figure 5:
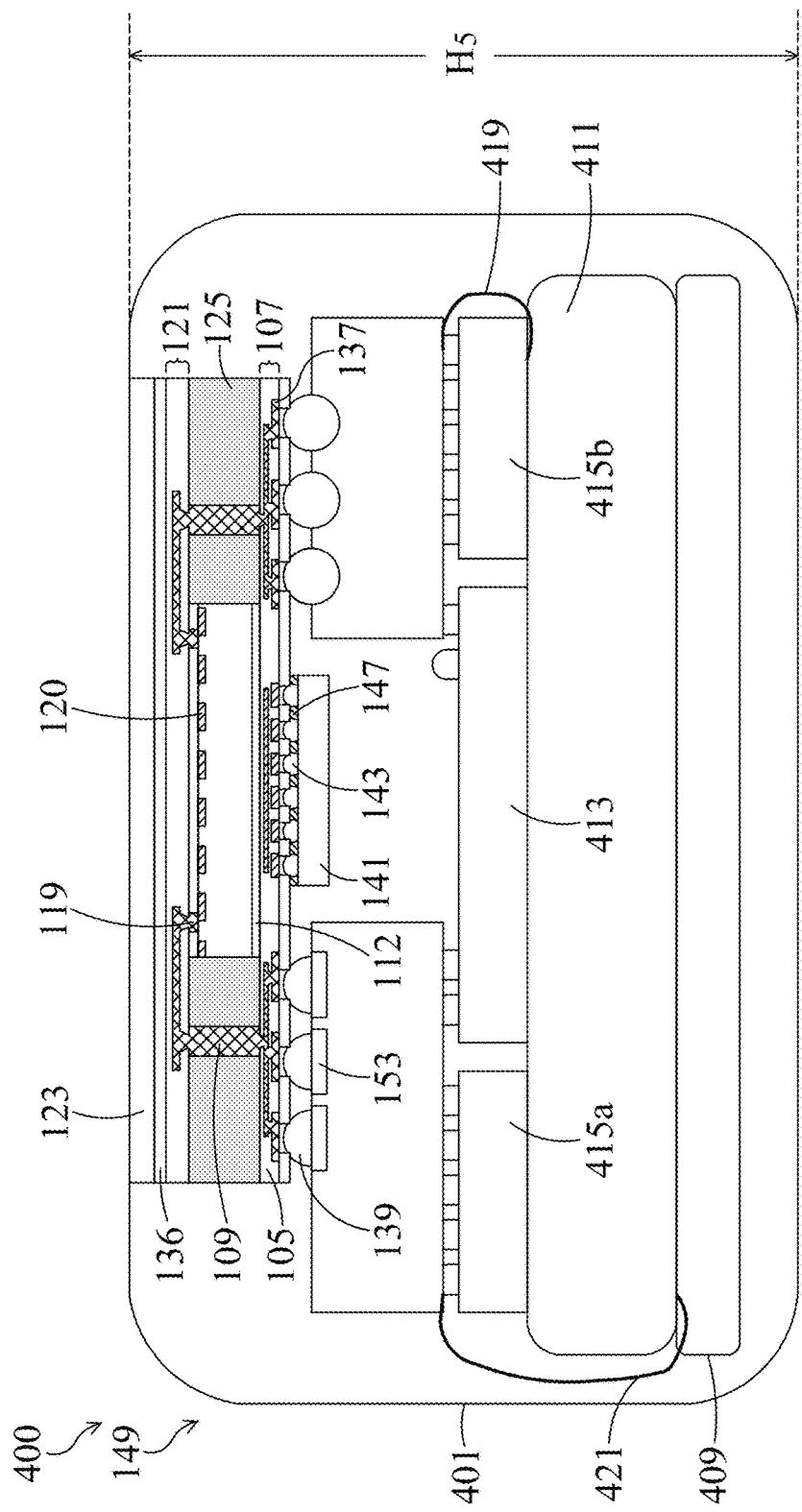
FIG. 5 illustrates an incorporation of the fingerprint sensor package into a semiconductor device in accordance with some embodiments.

FIG. 5 illustrates an alternative embodiment in which the savings in size may not be used to incorporate a larger battery, but may instead be used to reduce the overall size of the semiconductor device structure 400. In this embodiment the semiconductor device structure 400 may be reduced to have an overall fifth height $H_5$ of between about 8 mm and about 15 mm, such as about 10 mm. However, any suitable size may be utilized. By reducing the size, a smaller overall structure may be achieved.

Additionally, while the embodiments described in FIG. 4 and FIG. 5 are described with respect to the first sensor package 149 described above with respect to FIGS. 1A-1F, the embodiments are not limited to the first sensor package 149. Rather, any suitable sensor package, such as the second sensor package 200 or the third sensor package 300, may also be utilized. All suitable combinations are fully intended to be included within the scope of the embodiments.

In accordance with an embodiment, a method of manufacturing a fingerprint scanner comprising attaching a fingerprint sensor surface material over a fingerprint sensor is provided. The fingerprint sensor comprises a semiconductor substrate and an array of electrodes between the semiconductor substrate and the fingerprint sensor surface material. A high voltage chip is attached in electrical connection with the fingerprint sensor, wherein the high voltage chip is located on an opposite side of the fingerprint sensor than the fingerprint sensor surface material. The fingerprint sensor is attached to a substrate, wherein the high voltage chip is located within an opening of the substrate after the attaching the fingerprint sensor to the substrate.

In accordance with another embodiment, a method of manufacturing a fingerprint scanner, the method comprising forming through vias through a fingerprint sensor substrate is provided. An array of electrodes is formed over the fingerprint sensor substrate, wherein the array of electrodes are in electrical connection with active devices on a first side of the fingerprint sensor substrate, and a fingerprint sensor cover is attached over the first side of the fingerprint sensor substrate. A high voltage chip is attached in electrical connection with the active devices, wherein the high voltage chip is located on an opposite side of the fingerprint sensor substrate from the array of electrodes, and the high voltage chip is placed into an opening located within a second substrate.

In accordance with yet another embodiment, a semiconductor device comprising a fingerprint sensor is provided. Through vias electrically connect a first side of the fingerprint sensor with a conductive element located on a second side of the fingerprint sensor opposite the first side. A high voltage chip is in electrical connection with the through vias, and a substrate is in electrical connection with the through vias, wherein the high voltage chip is located within an opening of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a fingerprint sensor;
    through vias electrically connecting a first side of the fingerprint sensor with a conductive element located on a second side of the fingerprint sensor opposite the first side;
    a high voltage chip in electrical connection with the through vias; and
    a substrate in electrical connection with the through vias, wherein the high voltage chip is located within an opening of the substrate.

2. The semiconductor device of claim 1, wherein the conductive element is a redistribution layer.

3. The semiconductor device of claim 1, wherein the conductive element is a contact pad.

4. The semiconductor device of claim 1, wherein the through vias are located through a semiconductor substrate.

5. The semiconductor device of claim 1, wherein the through vias are located through an encapsulant and separated from the fingerprint sensor, the encapsulant in physical contact with the through vias.

6. The semiconductor device of claim 1, wherein the substrate is a printed circuit board.

7. A semiconductor device comprising:
    a sensor module;
    a first metallization layer located adjacent the sensor module;
    a second metallization layer located on an opposite side of the sensor module from the first metallization layer;
    a through via connecting the first metallization layer with the second metallization layer, the through via having a height at least as large as the sensor module; and
    a high voltage chip located on an opposite side of the second metallization layer from the sensor module.

8. The semiconductor device of claim 7, wherein the second metallization layer comprises underbump metallizations.

9. The semiconductor device of claim 7, further comprising an encapsulant encapsulating the sensor module and the through via.

10. The semiconductor device of claim 9, wherein the encapsulant is planar with a contact pad of the sensor module.

11. The semiconductor device of claim 7, further comprising a sensor surface material located on an opposite side of the sensor module from the high voltage chip.

12. The semiconductor device of claim 11, further comprising an interface layer between the sensor surface material and the first metallization layer.

13. The semiconductor device of claim 7, further comprising an interface layer adjacent to the first metallization layer.

14. The semiconductor device of claim 13, wherein there is no sensor surface material over the interface layer.

15. A semiconductor device comprising:
    a high voltage chip connected to a first redistribution layer;
    a through via electrically connected to the first redistribution layer;
    a sensor chip located adjacent to the through via; and
    a second redistribution layer electrically connecting the sensor chip to the through via, wherein a line extends through the high voltage chip, the first redistribution layer, the sensor chip, and the second redistribution layer in that order.

16. The semiconductor device of claim 15, further comprising an encapsulant in physical contact with the through via and extending from the through via to the sensor chip.

17. The semiconductor device of claim 16, wherein the encapsulant has a surface that is planar with the sensor chip.

18. The semiconductor device of claim 15, wherein the high voltage chip has a thickness of between about 70 μm and about 150 μm.

19. The semiconductor device of claim 15, further comprising:

an interface material adjacent to the second redistribution layer; and a sensor surface material adjacent to the interface material.

20. The semiconductor device of claim 15, further comprising a color film layer adjacent to the second redistribution layer.

* * * * *